United States Patent [19]

Streit et al.

[11] Patent Number: 5,262,660
[45] Date of Patent: Nov. 16, 1993

[54] HIGH POWER PSEUDOMORPHIC GALLIUM ARSENIDE HIGH ELECTRON MOBILITY TRANSISTORS

[75] Inventors: Dwight C. Streit, Redondo Beach; Kin L. Tan, Torrance; Po-Hsin Liu, Anaheim, all of Calif.

[73] Assignee: TRW Inc., Redondo Beach, Calif.

[21] Appl. No.: 739,046

[22] Filed: Aug. 1, 1991

[51] Int. Cl.$^5$ ................ H01L 29/80; H01L 27/02
[52] U.S. Cl. .................... 257/194; 257/190; 257/14; 257/18
[58] Field of Search ............ 357/22; 257/190, 194, 257/195, 192, 197, 280, 283, 284, , 285, 14, 18

[56] References Cited

U.S. PATENT DOCUMENTS

| | | | |
|---|---|---|---|
| 4,935,935 | 6/1990 | Reed et al. | 372/44 |
| 4,975,567 | 12/1990 | Bishop et al. | 357/4 X |
| 4,978,910 | 12/1990 | Knox et al. | 324/96 |
| 5,004,325 | 4/1991 | Glass et al. | 350/354 |
| 5,012,304 | 4/1991 | Kash et al. | 357/7 |
| 5,012,315 | 4/1991 | Shur | 357/23.14 |
| 5,021,841 | 6/1991 | Leburton et al. | 357/22 |
| 5,023,685 | 6/1991 | Bethea et al. | 357/30 |
| 5,023,944 | 6/1991 | Bradley | 455/611 |
| 5,038,187 | 8/1991 | Zhou | 357/22 |
| 5,079,620 | 1/1992 | Shur | 357/91 |
| 5,091,759 | 2/1992 | Shih et al. | 357/22 |
| 5,099,295 | 3/1992 | Ogawa | 357/16 |
| 5,132,746 | 7/1992 | Mendez et al. | 357/4 |

OTHER PUBLICATIONS

Phillip M. Smith, et al., A 0.25-μm Gate-Length Pseudomorphic HFET with 32-mW Output Power at 94 GHz., Oct. 1989, IEEE Electron Device Letters, vol. 10, No. 10.

Dwight C. Streit, et al., High-Gain W-Band Pseudomorphic InGaAs Power HEMT's, Apr. 1991, IEEE Electron Device Letters, vol. 12, No. 4.

K. L. Tan, et al., Ultralow-Noise W-Band Pseudomorphic InGaAs HEMT's, Jul. 1990, IEEE Electron Device Letters, vol. 11, No. 7.

Primary Examiner—John B. Sotomayor
Attorney, Agent, or Firm—Ronald L. Taylor

[57] ABSTRACT

A high power pseudomorphic (PM) AlGaAs/InGaAs high electron mobility transistor (HEMT) (26) with improved gain at 94 GHz. The transistor (26) includes an InGaAs quantum well (32) having a silicon planar doping layer (34) located at the bottom. A donor layer (36) comprises AlGaAs with a silicon planar doping layer (37). The resulting transistor (26) exhibits superior gain and noise characteristics that relatively high power levels when operating at 94 GHz. The transistor (26) is produced using an optimized growth process which involves growing the quantum well at a relatively low temperature and then raising the temperature to grow subsequent layers.

11 Claims, 3 Drawing Sheets

HIGH POWER PSEUDOMORPHIC GALLIUM ARSENIDE HIGH ELECTRON MOBILITY TRANSISTORS

CROSS-REFERENCE TO RELATED APPLICATION

The subject matter of this invention is related to co-pending U.S. patent application entitled, "Ultra Low Noise Pseudomorphic AlGaAs/InGaAs HEMT", Ser. No. 07/724,301 which is assigned to the same assignee as the present invention.

BACKGROUND OF THE INVENTION

1. Technical Field

This invention relates to microwave solid state devices, and more particularly to high power microwave pseudomorphic gallium arsenide high electron mobility transistors.

2. Discussion

Microwave semiconductor devices are used for the generation, amplification, detection, and control of electromagnetic energy in the frequency range of about 1-100 GHz. At such high frequencies, the usefulness of conventional transistors is severely limited by high-frequency effects, which result in a much lower signal-to-noise ratio.

Improvements in microwave field effect transistors have been realized by the use of gallium arsenide rather than silicon because the mobility of electrons of gallium arsenide is several times as high as in silicon. This higher mobility is particularly important at microwave frequencies, since it leads to lower series resistance and larger device dimensions for devices designed for operation at a given frequency.

For both low noise and power applications, pseudomorphic (PM) InGaAs high electron mobility transistors (HEMTs) have demonstrated superior millimeter wave performance. The large conduction-band discontinuity at the AlGaAs/InGaAs heterointerface allows for a high two-dimensional electron gas concentration. The InGaAs channel also offers superior electron transport properties (mobility and saturation velocity) compared to conventional GaAs channels used in AlGaAs/GaAs HEMTs.

However, previously reported power performance of PM InGaAs HEMT's have yielded relatively low gain. For example, in one report, after accounting for 2-dB insertion loss, the gain at power saturation was only 2–3 dB. See P. M. Smith et al. "A 0.25-micro gate-length pseudomorphic InGaAs HE FT with 32-mw output power at 94 GHZ," IEEE Electron Device Lett. Vol. 10, No. 10, pp. 437-439, 1989, which is herein incorporated by reference. Also, the peak transconductance (gm) v. gate-to-source voltage (Vgs) curve for such devices is relatively narrow.

Thus, it would be desirable to have a microwave power transistor which can operate at about 94 GHz and produce improved gain and a broad gm v. Vgs curve at high power levels.

SUMMARY OF THE INVENTION

Pursuant to one embodiment of the present invention, a gallium arsenide field affect transistor for operating at microwave frequencies is provided. The transistor includes a gallium arsenide (GaAs) substrate, which has a buffer layer on top of it. An indium gallium arsenide layer is deposited on top of the buffer layer. A layer of silicon planar doping within the indium gallium arsenide layer is placed near the bottom of the indium gallium arsenide layer. A donor layer of aluminum gallium arsenide is deposited on top of the indium gallium arsenide layer and an n-type gallium arsenide layer is deposited on top of the aluminum arsenide layer. A gate structure is disclosed on the aluminum gallium arsenide layer between gaps in the gallium arsenide layer. Finally source and drain ohmic layers are deposited on top of the gallium arsenide layer on opposite sides of the gate structure. The resulting transistor exhibits superior gain and noise characteristics at relatively high power levels when operating at 94 GHz.

In accordance with another embodiment of the present invention, a method of producing a gallium arsenide field effect transistor is provided which includes the steps of providing a substrate layer and growing a buffer layer on the substrate at a first predetermined temperature. Next, the temperature of the substrate is reduced to a lower second predetermined temperature and a quantum well layer is deposited at the second lower temperature. Next, the substrate temperature is increased back up to approximately the first predetermined temperature and a donor layer is deposited at this first temperature. Next, a contact layer is deposited to the donor layer and a gap is etched in the contact layer. A gate is then deposited on the donor layer in the gap and a source and drain are deposited on the contact layer.

BRIEF DESCRIPTION OF THE DRAWINGS

The various advantages of the present invention will become apparent to one skilled in the art by reading the following specification and by reference to the following drawings in which.

DESCRIPTION OF THE PREFERRED EMBODIMENTS

Figure 1:
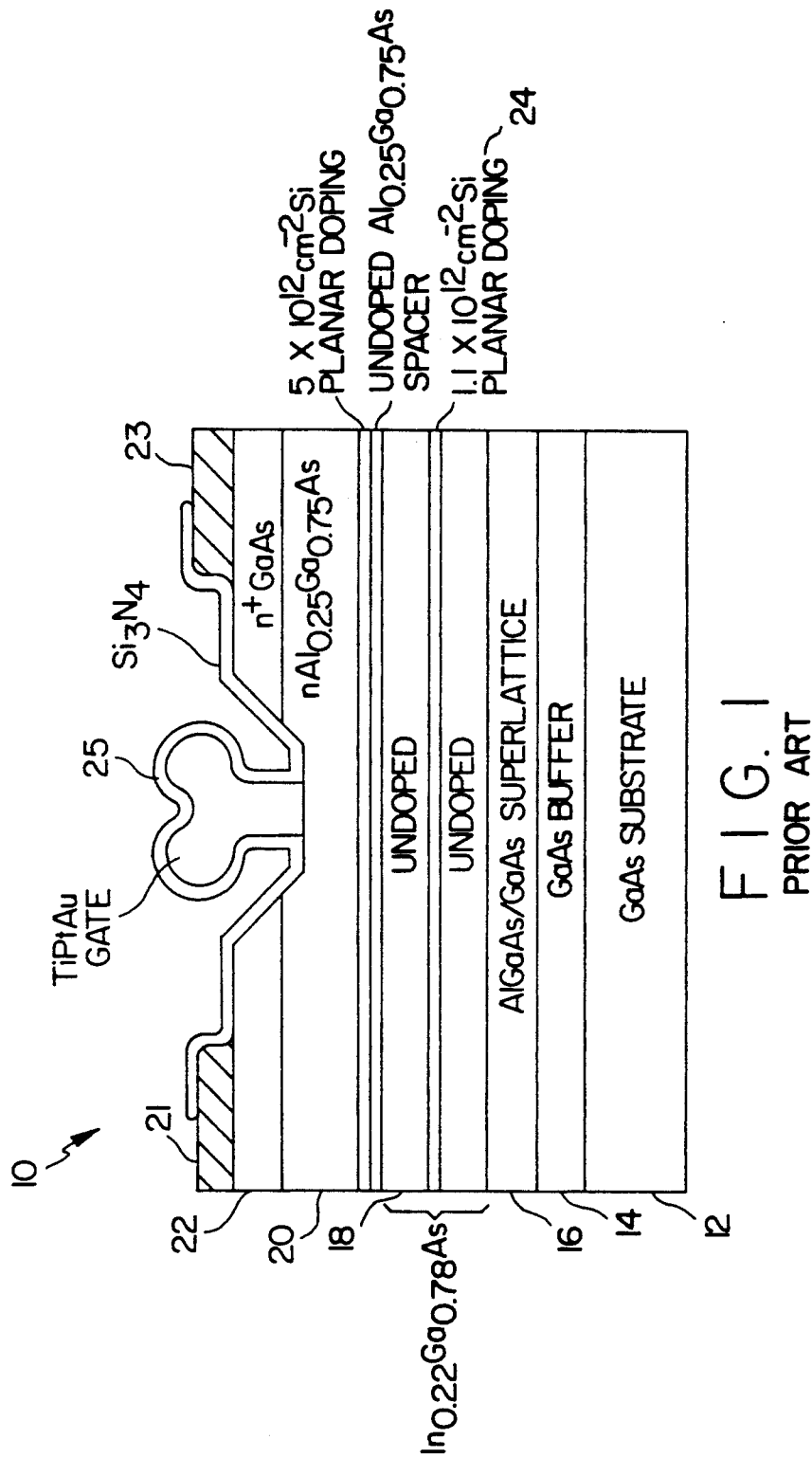
FIG. 1 is a diagrammatic cross-sectional view of a pseudomorphic InGaAs power HEMT in accordance with the prior art.

Referring now to FIG. 1, there is shown a pseudomorphic HFET 10 in accordance with the prior art. This high electron mobility transistor (HEMT) exhibits relatively high current handling capability and therefore power density, at 94 GHz. This result has been obtained in part by doping the AlGas layer 36 on both sides of the InGaAs quantum well, and by introducing planar doping. Planar doping in particular, refers to doping by means of depositing all of the donor silicon atoms in a single atomic/plane.

This prior art HFET 10 includes a GaAs substrate 12, a GaAs buffer 14, a AlGaAs/GaAs superlattice 16, InGaAs quantum well 18, AlGaAs donor layer 20 and an n+GaAs contact layer 22. The InGaAs layer 18 includes a $1.1 \times 10^{12}$ cm$^{-2}$ concentration planar doping 24 located at the center of the 125 angstrom thick InGaAs quantum well 18. Also, the AlGaAs donor layer 20 includes a $5 \times 10^{12}$ cm$^{-2}$ Si concentration planar doping to provide additional carriers to the quantum well 18. Also, a source 21, drain 23, and T-gate 25 are provided, as shown.

Further details of this transistor can be found in P. M. Smith et al. "A 0.25 mm gate length pseudomorphic InGaAs HFET with 32-mW output power at 94 GHz", IEEE Electron Device Lett. Vol. 10, No. 10 pp. 437–439, 1989, which is herein incorporated by reference. However, after accounting for 2-dB insertion loss, the gain at power saturation of the device shown in FIG. 1 is only 2–3 dB. In order to improve the gain of the power performance at 94 GHz, the present invention provides an improved HEMT as shown in FIG. 2.

Figure 2:
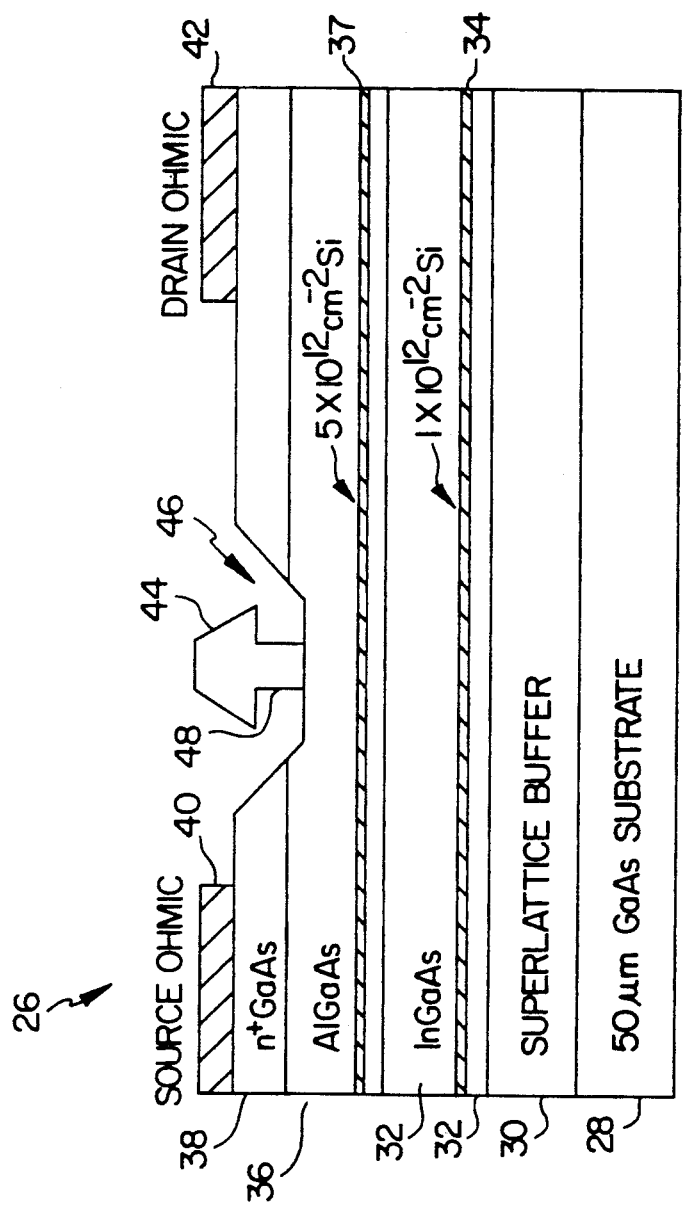
FIG. 2 is a cross-sectional diagrammatic view of the pseudomorphic InGaAs power HEMT in accordance with the present invention.

In more detail, the HEMT 26 in FIG. 2 includes a 50 mm GaAs substrate 28 at the bottom (also referred to as the "rear") on top of this substrate 28 is a superlattice buffer layer 30. It will be appreciated that a superlattice is a multilayer structure which may consist, for example, of several layers of alternating GaAs and AlGaAs layers. This is followed by a 150 angstrom pseudomorphic (PM) InGaAs layer 32 having a $1 \times 10^{12}$ cm$^{-2}$ concentration silicon planar doping 34. As can be seen from FIG. 2, the planar doping channel 34 is positioned asymmetrically within the InGaAs layer 32. In accordance with the preferred embodiment, the channel planar doping 34 is placed 100 angstroms from the top (front) of the 150 angstrom thick InGaAs layer 32. In contrast, in the transistor 10, in accordance with the prior art shown in FIG. 1, the planar doping layer 24 within the InGaAs layer 18 is positioned symmetrically, in the center of the channel. It is believed that the asymmetric position of the planar doping layer 34 in FIG. 2 contributes significantly to the improved performance of the present invention. This asymmetric placement of the silicon planar doping results in a broad $g_m$ v. $G_{gs}$ characteristic, but with a higher aspect ratio compared to double and triple heterojunction power HEMT's which can exhibit multiple transconductance peaks and poor gate control if not properly optimized.

The transistor structure 26 was grown by molecular beam epitaxy with an indium mole fraction of 22%. On top of the InGaAs layer 32 is a 300 angstrom AlGaAs layer 36 which has an aluminum mole fraction of 25% and a silicon planar doping layer 37. This is followed by a 400 angstrom, $6 \times 10^{18}$ cm$^{-3}$ silicon concentration GaAs contact layer 38. Hall measurements yielded in electron sheet charged density of $3.2 \times 10^{12}$ cm$^{-2}$ with a mobility of 3770 cm$^2$/V.s at 300 K, and $3.0 \times 10^{12}$ cm$^{-2}$ with a mobility of 6490 cm$^2$/V.s at 77 K.

Also, a source 40 and drain 42 made of ohmic materials are located on the contact layer 38. A T-gate 44 has a 40-($\mu$m) width an 0.1 ($\mu$m) length at its base 48. The transistor 26 was fabricated using a known 0.1 ($\mu$m) T-gate PM InGaAs HEMT process which is described in further detail in the article, K. L. Tan et al., "Ultra low-noise W-band Pseudomorphic InGaAs HEMTs", IEEE Electron Device Lett. Vol. 11, No. 7, pp. 303–305, 1990, which is herein incorporated by reference. The T-gate resistance is less than 200 ohms/mm, compared to about 1500 ohms/mm for regular 0.1 ($\mu$m) gates.

Reactive ion etching was used to make 40-($\mu$m) source vias in order to reduce the source inductance introduced by bonding wires or ribbons, with two vias per device for the 40 and 80-($\mu$m) gate-width devices, and three vias for the 160-($\mu$m) devices. Calculations of maximum power gain v. source inductance for 40-(mu) gate-width devices show that a gain increase of 3.4 dB can be expected at 94 GHz due to the use of source vias rather than bonding ribbon. The completed wafers were thinned to 50-$\mu$m to improve thermo dissipation, then plated with 3 to 5 ($\mu$m) of gold. The devices were not passavated.

In accordance with a preferred embodiment of the present invention, an optimized growth process is employed to produce the transistor 26. In general, this optimized growth process involves growing the InGaAs quantum well 32 at a relatively low temperature (with respect to the rest of the structure). In a preferred embodiment, after the superlattice buffer 30 is grown at approximately 600° C., the temperature of the buffer is reduced by an amount that depends on the mole fraction of the Indium to be used. That is, the higher the Indium mole fraction (the higher the Indium composition), the lower the temperature used to optimize the material quality. For example, if the Indium mole fraction is 15% the temperature may be lowered to 540° C.; if the Indium mole fraction is 22%, the temperature may be lowered to 520° C.; and if the Indium mole fraction is 28%, the temperature may be lowered to 500° C.

Once, the substrate temperature is lowered to that predetermined level the InGaAs film is deposited at that temperature. After the InGaAs channel is finished, however, rather than just continuing from that point, the growth process is stopped there and the substrate temperature is increased back up to the normal growth temperature (such as 600° C.) before anything else is done. Thus, the InGaAs layer is now at the surface top of the substrate 30, (it's the last layer that has been grown) and the substrate is brought up to 600° C. before depositing the rest of the layers. These may be some concern that this increase in the temperature of the InGaAs film would damage it. However, the present inventors have found that if there is a very high arsenic flux present, damage to the InGaAs layer can be avoided. As a result, when the AlGaAs layer is applied on top of the InGaAs layer, it results in a much better quality than if both layers had been deposited at the same temperature.

To summarize, after depositing the InGaAs layer at a low temperature, growth is stopped and the substrate temperature is increased while maintaining a high arsenic flux throughout. It should be noted that it appears that the above temperature procedure will not be successful without the high arsenic flux and conversely that the high arsenic flux will not have the same effect without utilizing the above described temperature procedure. In particular, an arsenic flux of $1.2 \times 10^{-5}$ Torr is sufficiently high for these purposes. As a result, the InGaAs material appears to be optimized for its growth condition and the AlGaAs donor layer also appears to be optimized for its growth conditions.

The completed devices were characterized for dc and RF on-wafer performance from 1 to 26 GHz before wafer thinning. The average transconductance for 80-$\mu$m devices was 687 mS/mm with a maximum of 778 mS/mm. The average ft as measured by extrapolating the short-circuit current gain was 120 GHz, with a maximum of 130 GHz. The maximum drain current as measured at a drain voltage of 2 V and a gate voltage of 1 V was 750 mA/mm. Although a much higher drain current is possible by increasing the planar doping in the InGaAs channel or by gate recessing to a more depletion-mode device, this was not done in order to obtain the high device breakdown essential for power device operation. The gate-drain breakdown voltage at 1 mA/mm gate current was typically greater than 6 V.

The devices were evaluated in single-stage MIC amplifier fixtures utilizing antipodal finline-type waveguide-to-microstrip transitions. The typical end-to-end insertion loss for these transitions is 1.4 dB at 94 GHz. Table I summarizes the 96-GHz power performance of the various devices.

TABLE I

| | 94-GHz Power HEMT Performance | | | |
|---|---|---|---|---|
| Gate Width μm | Pae % | Linear Grain dB | Sat. Grain dB | Power mW |
| 40 | 14.3 | 9.6 | 7.3 | 10.6 |
| 80 | 15.1 | 7.2 | 4.6 | 22.7 |
| 160 | 13.2 | 7.4 | 4.0 | 62.7 |

Figure 3:
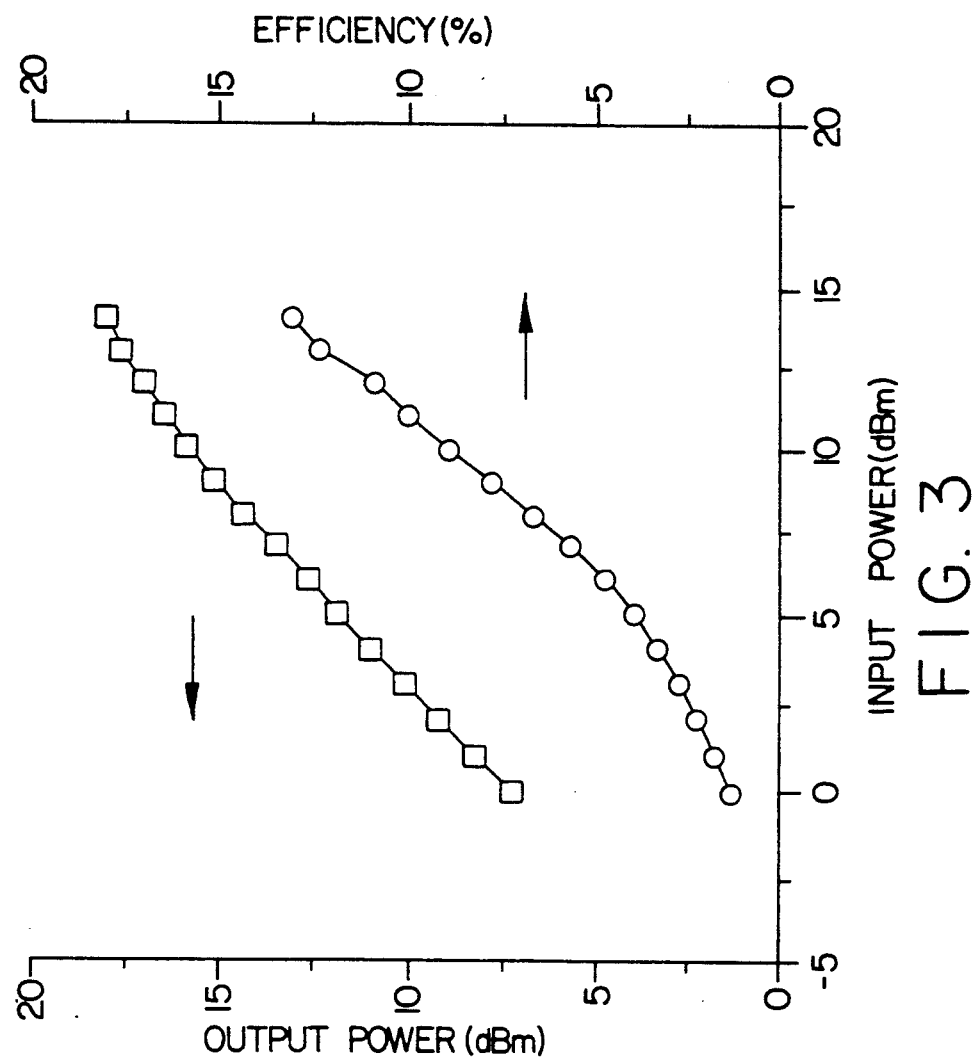
FIG. 3 is a graph of the output power and efficiency v. input power of the pseudomorphic InGaAs power HEMT in accordance with the present invention.

A $0.1 \times 40$-pm² device evaluated in this fixture at a drain bias of 3.5 V achieved a linear gain of 9.6 dB, which corresponds to an $f_{max}$ of 290 GHz. The device had an output power of 10.6 mW (265 mW/mm) with 7.3-dB gain and 14.3% power added efficiency (PAE). The same device with a higher drain bias of 4.3 V exhibits a higher output power of 12.5 mW (313 mW/mm) with 6-dB gain and PAE of 15.1% at a drain bias of 3 V. An eight-finger device with 160-pm gate periphery achieved 7.4 dB linear gain, and 62.7 mW output power (392 mW/mm) with 4.0 dB gain and a PAE of 13.2% at a drain bias of 3.4 V. The power and efficiency characteristics of this device are shown in FIG. 3. Saturation was not reached due to the 14-dBm input power limitation of the test equipment.

Further details of this device 26, can be found in D.C. Streit, et al., "High Gain W-Band Pseudomorphic InGaAs Power HEMT's", IEEE Electron. Device Lett. Vol. 12, No. 4, pp. 149-150, April 1991, which is herein incorporated by reference.

Those skilled in the art can appreciate that other advantages can be obtained from the use of this invention and that modification may be made without departing from the true spirit of the invention after studying the specification, drawings and following claims.

What is claimed is:

1. A gallium arsenide (GaAs) field effect transistor comprising:
   a GaAs substrate layer;
   a buffer layer deposited on top of said GaAs substrate;
   an InGaAs quantum well deposited on top of said buffer;
   a layer of silicon planar doping within said InGaAs quantum well, and deposited near the bottom of said InGaAs quantum well;
   a donor layer of AlGaAs deposited on top of said InGaAs quantum well;
   an n-type GaAs contact layer deposited on top of said AlGaAs donor layer;
   a gate structure deposited on said AlGaAs donor layer between gaps in said GaAs layer; and
   source and drain ohmic layers deposited on top of said GaAs layer on opposite sides of said gate structure.

2. The transistor of claim 1 wherein said buffer layer is a superlattice type material.

3. The transistor of claim 1 wherein said InGaAs layer is approximately 150 angstroms thick and said silicon planer doping layer is located approximately 50 angstroms from the buffer.

4. The transistor of claim 3 wherein said InGaAs layer has an Indium mole fraction of 22%.

5. The transistor of claim 1 wherein said silicon planar doping layer in said InGaAs quantum well is composed of $1 \times 10^{12}$ cm$^{-2}$Si.

6. The transistor of claim 1 wherein said AlGaAs donor layer includes a silicon planer doping layer deposited within.

7. The transistor of claim 1 wherein said AlGaAs donor layer is approximately 300 angstroms thick.

8. The transistor of claim 7 wherein said AlGaAs layer has an aluminum mole fraction of approximately 25%.

9. The transistor of claim 1 wherein said n type GaAs contact layer is approximately 400 angstroms thick.

10. The transistor of claim 1 wherein said gate is a T-shaped gate of approximately 0.1-μm in length.

11. A high power pseudomorphic AlGaAs/InGaAs HEMT for use at microwave frequencies comprising:
    a GaAs substrate layer;
    a superlattice buffer layer deposited on top of said GaAs substrate;
    an InGaAs quantum well deposited on top of said buffer having an Indium mole fraction of approximately 22%, said quantum well being approximately 150 angstroms thick;
    a layer of silicon planar doping within said InGaAs quantum well deposited approximately 50 angstroms from the superlattice buffer;
    a donor layer of AlGaAs deposited on top of said InGaAs quantum well;
    an n-type GaAs contact layer deposited on top of said AlGaAs donor layer;
    a T-shaped gate structure of approximately 0.1 μm in length deposited on said AlGaAs donor layer between gaps in said GaAs layer; and
    source and drain ohmic layers deposited on top of said GaAs layer on opposite sides of said gate structure.

* * * * *